United States Patent [19]
Pelley, III

[11] Patent Number: 5,323,360
[45] Date of Patent: Jun. 21, 1994

[54] LOCALIZED ATD SUMMATION FOR A MEMORY

[75] Inventor: Perry H. Pelley, III, Austin, Tex.

[73] Assignee: Motorola Inc., Schaumburg, Ill.

[21] Appl. No.: 55,596

[22] Filed: May 3, 1993

[51] Int. Cl.$^5$ ............................................. G11C 8/00
[52] U.S. Cl. ........................... 365/233.5; 365/189.110; 365/230.03
[58] Field of Search ................ 365/233.5, 233, 230.03, 365/189.11

[56] References Cited

U.S. PATENT DOCUMENTS

| | | | |
|---|---|---|---|
| 4,636,991 | 1/1987 | Flannagan et al. | 365/230 |
| 4,689,771 | 8/1987 | Wang et al. | 365/233.5 |
| 4,872,143 | 10/1989 | Sumi | 365/233.5 |
| 4,893,282 | 1/1990 | Wada et al. | 365/233.5 |
| 5,072,131 | 12/1991 | Nakano | 307/231 |
| 5,159,572 | 10/1992 | Morton | 365/230.06 |
| 5,197,030 | 3/1993 | Akaogi et al. | 365/233.5 |
| 5,267,216 | 11/1993 | Gabillard et al. | 365/233.5 |

OTHER PUBLICATIONS

IEEE Journal of Solid State Ciruits-vol SC21, No. 5, Oct. 1986 Kayano et al, "25-ns 256K×1/64K×K×4 CMOS SRAM's" pp. 686-690.

Takashi Akioka et al., "A 6-ns 256-kb BiCMOS TTL SRAM", IEEE Journal of Solid-State Circuits, vol. 26, No. 3, Mar. 1991, pp. 439-443.

Masataka Matsui et al., "An 8-ns 1-Mbit ECL BiCMOS SRAM With Double-Latch ECL-to-CMOS-Level Converters", IEEE Journal of Solid-State Circuits, vol. 24, No. 5, Oct. 1989, pp. 1126-1132.

Fumio Miyaji et al., "A 25-ns 4-Mbit CMOS SRAM With Dynamic Bit-Line Loads", IEEE Journal of Solid-State Circuits, vol. 24, No. 5, Oct. 1989, pp. 1213-1218.

Primary Examiner—Eugene R. LaRoche
Assistant Examiner—Tan Nguyen
Attorney, Agent, or Firm—Daniel D. Hill

[57] ABSTRACT

A memory (110) having sections of memory cells used ATD to generate the required timing signals, includes ATD generators (189), first summation circuits (180–183), and local summation circuits 185–187. An ATD pulse is generated by the ATD generators (189) when an address signal transitions from one logic state to another. The outputs of the ATD generators (189) are wired-OR connected to input terminals of first summation circuits (180–183). A first summation signal is provided by the first summation circuits (180–183) to each of the local summation circuits (185–187). The local summation circuits (185–187) are positioned in the vicinity of the areas where the timing signals are used. Localized generation of the ATD signals prevents the timing signals for being excessively skewed from each other in different portions of the memory (110).

20 Claims, 8 Drawing Sheets

LOCALIZED ATD SUMMATION FOR A MEMORY

CROSS-REFERENCE TO RELATED, COPENDING APPLICATIONS

A related, copending application is entitled "Address Buffer With ATD Generation", Perry H. Pelley, III, Ser. No. 08/007,879, filed on Jan. 22, 1993, and assigned to the assignee hereof.

FIELD OF THE INVENTION

This invention relates generally to address transition detection (ARD), and more particularly to localized ATD summation for a memory.

BACKGROUND OF THE INVENTION

Integrated circuit memories, such as static random access memories (SRAMs) require increasingly short access times. SRAMs are often used in the portion of a processing system where speed is very important, such as a cache memory for microprocessor. Address transition detection is one method that has been used to decrease access time by allowing a memory access to begin as soon as a change in an address is detected. ATD decreases memory access times, and may also reduce power consumption, by providing both preconditioning signals and activation signals in the memory. For example, ATD may be used for a word line driving, bit line driving and precharge, data line sensing, and for data outputting.

An address transition detector generates a pulse in response to an address change. It is typical to have a separate address transition detector for each address signal which transitions are to be detected. For example, if a transition of the row address is to be detected, then an address transition detector is commonly used for a row address signal. The output pulses of these detectors are then logically combined by logic gates to provide a single summation signal. This summation signal is then used to provide timing and control signals for the memory.

In the past, the summation of ATD pulses has been accomplished by using centrally located ATD summation logic circuitry. Metal lines have been used to route the ATD summation signal to portions of the memory where the ATD summation signal is to be used, such as to the word line drivers or to the bit line loads. However, as memories increase in size and density, the distance from the centrally located ATD summation circuitry to the most distant circuits of the memory increases, resulting in the need for longer metal lines. A problem with using longer metal lines to route the ATD pulses is the increased parasitic capacitance that the centrally located ATD summation logic circuit must drive, increasing power consumption, and requiring the use of larger drive transistors in the centrally located ATD summation logic circuitry. In addition, the timing signals may be excessively skewed from one another in different portions of the memory because the signals have to travel different distance across the memory. Excessively skewed timing signals may seriously degrade the performance and reliability of the memory.

SUMMARY OF THE INVENTION

Accordingly, there is provided, in one form, an integrated circuit memory that includes a plurality of blocks of memory cells, address decoders, a plurality of address transition detectors, first summation circuit, and local summation circuits. Each block or memory cells includes a plurality of memory cells located at intersections of word lines and bit line pairs. The address decoders receive a plurality of address signals, and in response, provide decoded address signals for selecting a memory cell. Each addressing transition detector has an input terminal coupled to one of the address signals, and provides an ATD (address transition detection) pulse at an output terminal in response to detecting when the address signal coupled to its input terminal transitions from one logic state to another. The first summation circuit is coupled to the output terminals of the address transition detectors. The first summation circuit provides a first summation signal in response to at least one of the plurality of address transition detectors providing an ATD pulse. The local summation circuits are positioned adjacent to the plurality of blocks of memory cells. Each local summation circuit is coupled to a predetermined number of the plurality of blocks of memory cells, and to the first summation circuit. The local summation circuits receive the first summation signal, and provide local ATD signals for providing timing and activation control signals for the predetermined number of blocks of memory cells. These and other features and advantages will be more clearly understood from the following detailed description taken in conjunction with the accompanying drawings.

DESCRIPTION OF A PREFERRED EMBODIMENT

Figure 1:
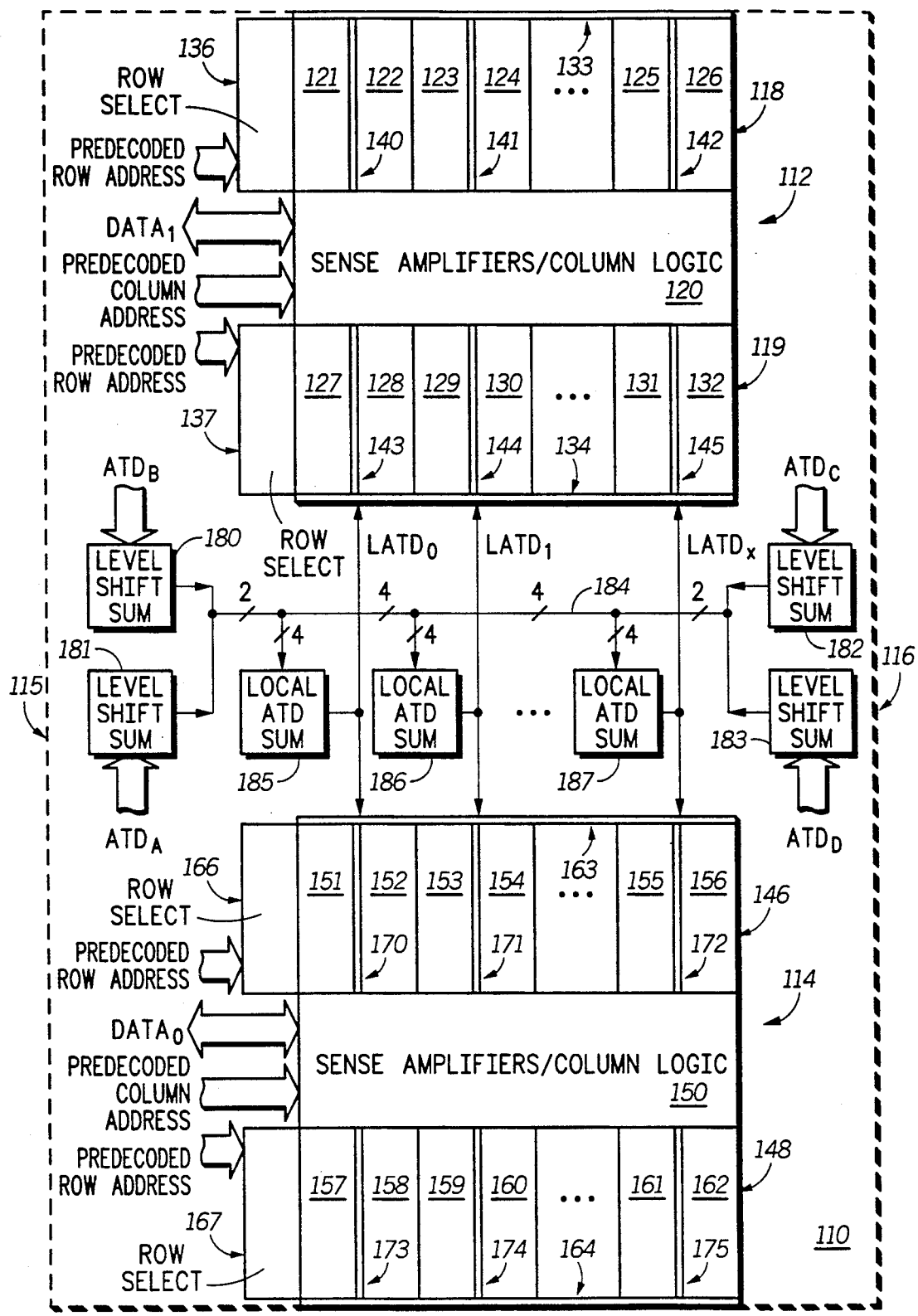
FIG. 1 illustrates in block diagram form a memory in accordance with the present invention.

FIG. 1 illustrates in block diagram form, a memory 110 in accordance with the present invention. Memory 110 includes top half 112, bottom half 114, left periphery 115, right periphery 116, level shifting summation circuits 180–183, and local ATD summation circuits 185–187. Top half 112 includes memory sections 118 and 119, sense amplifiers/column logic 120, row select circuits 136 and 137, word line drivers 140–145, and bit line load sections 133 and 134. Memory section 118 includes memory blocks 121–126, and memory section 119 includes memory blocks 127–132. Bottom half 114 includes memory sections 146 and 148, sense amplifiers/column logic 150, row select circuits 166 and 167, word line drivers 170–175, and bit line load sections 163 and 164. Memory section 146 includes memory blocks 151-156, and memory section 148 includes memory blocks 157-162.

Memory 110 is an integrated circuit BICMOS SRAM that operates with a power supply voltage equal to approximately 3.3 volts. BICMOS circuits are constructed by including bipolar transistors and complementary metal-oxide-semiconductor (CMOS) transistors on the same integrated circuit. Input signals are provided at ECL (emitter-coupled logic) levels. With a power supply voltage equal to 3.3 volts, an ECL logic low voltage is equal to about −1.7 volts and an ECL logic high voltage is equal to about −1.0 volts. The ECL level signals are level converted, or level shifted to BICMOS logic levels by level converting, or level shifting circuits.

Figure 2:
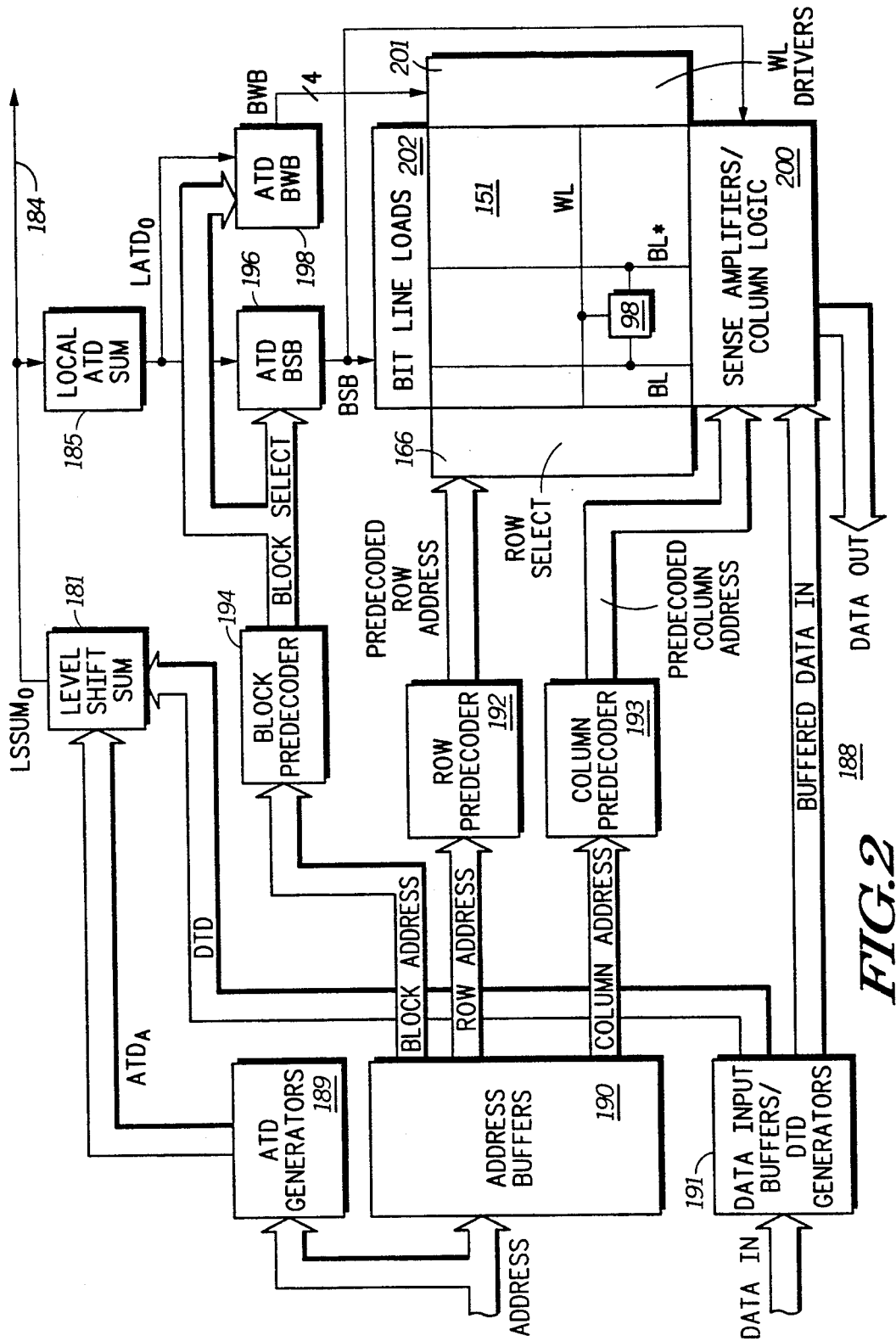
FIG. 2 illustrates in block diagram form a first portion of the memory of FIG. 1.

Each of memory sections, or quadrants 118, 119, 146, and 148 has a predetermined number of memory blocks, such as memory blocks 121-126 in memory section 118. Located between alternating memory blocks are the word line drivers. For example, word line drives 140 are located between memory blocks 121 and 122 and drive the word lines of both of the memory blocks. The bit line loads for all of the memory blocks in memory section 118 are located in bit line load section 133. The bit line loads for all of the memory blocks in memory section 119 are located in bit line load section 134. The bit line loads for all of the memory blocks in memory section 146 are located in bit line load section 163. The bit line loads for all of the memory blocks in memory section 148 are located in bit line load section 164. Row select circuits 136 has an input for receiving predecoded row address signals labeled "PREDECODED ROW ADDRESS", and provides row select signals for selecting a word line in memory section 118. Row select circuits 137 has an input for receiving predecoded row address signals PREDECODED ROW ADDRESS, and provides row select signals for selecting a word line in memory section 119. Row select circuits 166 has an input for receiving predecoded row address signals PREDECODED ROW ADDRESS, and provides row select signals for selecting a word line in memory section 146. Row select circuits 167 has an input for receiving predecoded row address signals PREDECODED ROW ADDRESS, and provides row select signals for selecting a word line in memory section 148. Sense amplifiers/column logic 120 includes the sense amplifiers and column decoders for each bit line pair of memory blocks 121-132 of top half 112 and sense amplifiers/column logic 150 includes the sense amplifiers and column decoders for each bit line pair of memory blocks 151-162 of bottom half 114. Predecoded column address signals labeled "PREDECODED COLUMN ADDRESS" are provided to sense amplifiers/column logic 120 and to sense amplifiers/column logic 150. The sense amplifiers detect and amplify complementary data signals on the bit line pairs and provide output data signals to output circuitry (not shown). Some address decoding circuitry not illustrated in FIG. 1 is illustrated in FIG. 2. Data signals are indicated in FIG. 1 with a single bi-directional arrow labeled "DATA$_0$" for input and output data for sense amplifiers/column logic 150, and labeled "DATA$_1$" for input and output data for sense amplifiers/column logic 120.

Level shifting summation circuits 180 and 181 are located in a central portion of left periphery 115 and receive ATD pulses labeled "ATD$_B$" and "ATD$_A$", respectively. Level shifting summation circuits 182 and 183 are located in a central portion of right periphery 116 and receive ATD pulses labeled "ATD$_C$" and "ATD$_D$", respectively. The ATD pulses are provided by ATD generators located in left periphery 115 and in right periphery 116. For example, in response to an address transition, ATD pulses ATD$_A$ are provided by ATD generator circuits (illustrated in FIG. 2) located in left periphery 115 adjacent to bottom half 114. Output terminals of each of the ATD generators are wired-OR, or emitter dot, connected to their respective level shifting summation circuits (illustrated in FIG. 3). Output terminals of each level shifting summation circuit are wired-OR connected to each local summation circuit (illustrated in FIG. 3). Each of level shifting summation circuits 180-183 provides an ATD summation signal to each of local summation circuits 185-187. ATD bus 184 is positioned between sections 119 and 146 and connects each of level shifting summation circuits 180-183 to each of local summation circuits 185-187. In response to receiving an ATD pulse, each level shifting summation circuit that receives an ATD pulse provides a summation signal to each of local summation circuits 185-187.

Each local summation circuit 185-187 provides a local ATD signal to a predetermined number of memory blocks in memory sections 118, 119, 146, and 148 to provide timing and activation signals in those memory blocks. In the preferred embodiment, there are 16 memory blocks in each memory section, and a total of eight local summation circuits for memory 110. (Only three local summation circuits are shown in FIG. 1 for clarity.) Each local summation circuit provides a local ATD signal to eight adjacent memory blocks. For example, local summation circuit 185 provides a local ATD signal labeled "LATD$_0$" to memory blocks 121, 122, 127, 128, 151, 152, 157, and 158. Local summation circuit 186 provides a local ATD signal labeled "LATD$_1$" to memory blocks 123, 124, 129, 130, 153, 154, 159, and 160. Local summation circuit 187 provides a local ATD signal labeled "LATD$_X$" to memory blocks 125, 126, 131, 132, 155, 156, 161, and 162.

Using a number of local summation circuits allows the use of shorter metal lines to route the ATD signals, than if a centrally located ATD summation circuit were used. This provides the advantage of lower line capacitance, lower power consumption, reduced propagation delays, and allows the use of smaller transistors in the drive stages. Reducing propagation delays reduces skewing of critical timing signals relative to different locations in the memory since the ATD summation signals are generated locally, or at their point-of-use. Smaller drive transistors may be used at the output terminals of level shifting summation circuits 180-183 and at the output terminals of local summation circuits 185-187.

FIG. 2 illustrates in block diagram form a portion 188 of memory 110 of FIG. 1. Portion 188 illustrates some additional detail of the circuitry located in the lower half of left periphery 115 of FIG. 1. Circuitry similar to portion 188 is located in the upper half of left periphery 115, and in the upper and lower halves of right periphery 116 of FIG. 1. Portion 188 includes address buffers 190, ATD generators 189, data input buffers/DTD generators 191, row predecoder 192, column predecoder 193, block predecoder 194, level shifting summation circuit 181, local summation circuit 185, first local logic circuit 196, second local logic circuit 198, row select circuit 166, word line drivers 201, bit line loads 202, memory block 151, and sense amplifiers/column logic 200. Note that the row predecoders, column predecoders, and block predecoders are generally located near their respective address pads (not shown). Therefore, some of the address predecoder circuitry shown in FIG. 2 may not be located in all of the circuit portions located in the upper and lower halves of both the left and right perpheries 115 and 116. All of the address predecoder circuitry is shown in FIG. 2 for ease of illustration only. Memory cells in memory block 151 are located at intersections of word lines and bit line pairs. Each memory cell is coupled to a word line and a bit line pair. Each bit line pair serves as an input to the memory cells during the write cycle of memory 110 and as an output during the read cycle. A representative memory cell 98 is shown coupled to a word line labeled "WL", and to a pair of bit lines labeled "BL" and "BL*". (Note that an asterisk "*" after a signal name indicates that the signal is a logical complement of a signal having the same name but lacking the asterisk "*".) Each memory block of memory 110 includes 1024 word lines and 256 bit line pairs.

Address buffers 190 receives ECL level address signals labeled "ADDRESS", and provides block address signals labeled "BLOCK ADDRESS", row address signals labeled "ROW ADDRESS", and column address signals labeled "COLUMN ADDRESS". ATD generators 189 receives ECL level address signals ADDRESS and provides ATD signals labeled "$ATD_A$". Block logic 194 receives block address signals BLOCK ADDRESS and provides block select signals labeled "BLOCK SELECT". The block select signals select a memory block to be accessed. In addition, they further decode the word line drives by making a one of four selection. Only one memory block is selected at a time. Row predecoder 192 receives row address signals ROW ADDRESS and provides predecoder row address signals labeled "PREDECODED ROW ADDRESS". Column predecoder 193 receives column address signals COLUMN ADDRESS and provides predecoded column address signals labeled "PREDECODED COLUMN ADDRESS". Data input buffers/DTD generators 191 receives input data signals labeled "DATA IN", and provides buffered input data signals labeled "BUFFERED DATA IN", and data transition detection signals labeled "DTD". Note that the particular address signals have no special significance and may be different in other embodiments. Also, the amount of decoding performed by the row, column, and block predecoders may be different in other embodiments. In addition, the locations of the row, column, and block predecoders may be different in other embodiments.

First summation circuit 181 receives address transition detection signals $ATD_A$ and data transition detection signals DTD, and provides a level shifted summation signal labeled "$LSSUM_0$". Local summation circuit 185 receives level shifted summation signal $LSSUM_0$ from level shifting summation circuit 181 via ATD bus 184, and has an output terminal for providing local ATD signal $LATD_0$. First local logic circuit 196 has an input terminal connected to the output terminal of local summation circuit 185 for receiving local ATD signal $LATD_0$, and an output terminal for providing a control signal labeled "BSB". Second local logic circuit 198 has first input terminals for receiving block select signals BLOCK SELECT, a second input terminal for receiving local ATD signal $LATD_0$, and output terminals for providing a control signal labeled "BWB". Sense amplifiers/column logic 200 are a portion of sense amplifiers/column logic 150 of FIG. 1. Each of the 256 bit line pairs of memory block 151 is connected to sense amplifiers/column logic 200 and to bit line loads 202. Bit line loads 202 are the portions of bit line load section 163 that are connected to the bit line pairs of memory block 151. Predecoded column address signals labeled "PREDECODED COLUMN ADDRESS" are received by sense amplifiers/column logic 200. The sense amplifiers detect and amplify complementary data signals on the bit line pairs and provide output data signals labeled "DATA OUT" to data output circuitry (not shown). Control signal BSB is for activating bit line loads 202 during a write recovery operation or a read recovery operation. A write recovery operation occurs at the end of a write cycle to recharge the bit line pairs to a predetermined precharge voltage. A read recovery operation is similar to a write recovery, except that it occurs during a read operation. Bit line loads 202 are known in the art and are for recharging the bit lines to a precharge voltage equal to substantially the power supply voltage. Control signal BSB is also provided to sense amplifiers/column logic 200 for activating the appropriate bit line pair for inputting or outputting data to the selected memory cell of memory block 151.

Figure 5:
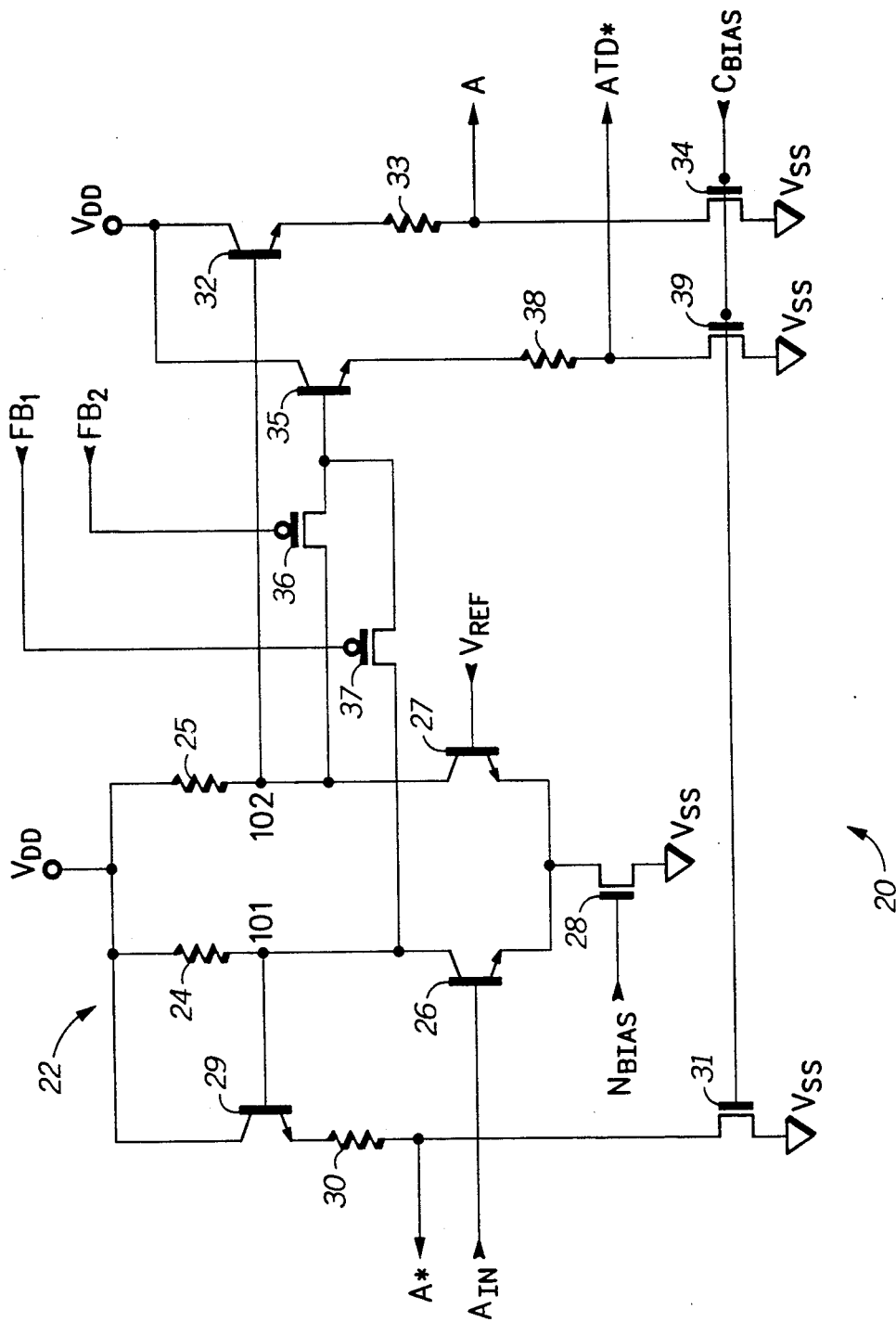
FIG. 5 illustrates in schematic diagram form an address buffer with ATD generation in accordance with the present invention.

During a read cycle or a write cycle of memory 110, ECL level address signals ADDRESS are provided to address buffers 190 and to ATD generators 189. (A preferred embodiment of an address buffer which includes ATD generation without additional separate ATD generation circuits is illustrated in FIG. 5.) ATD generators 189 includes an ATD generator for each individual address signal for which an address signal transition is to be detected. In a preferred embodiment, all of the address signals are provided to ATD generators 189. When a transistion of an address signal is detected, the ATD generator coupled to that address signal provides an ECL level, negative, ATD pulse. The ECL level negative ATD pulse is inverted, and then provided by ATD generators 189 to level shifting summation circuit 181 as a positive ECL level ATD pulse.

First summation circuit 181 level shifts, or level converts, the ECL level ATD pulses to BICMOS logic levels. First summation signal $LSSUM_0$ is the result of a logical OR operation of ATD signals $ATD_A$, and is provided to each of local summation circuits 185–187. Note that a logic high BICMOS logic level is equal to approximately one $V_{BE}$ below the positive power supply voltage. A logic low BICMOS logic level is equal to approximately the negative power supply voltage if a MOS pull down transistor is used, or one $V_{BE}$ above the negative power supply voltage if a bipolar pull down transistor is used. Note that BICMOS logic levels are internal logic levels, and typically have a wider logic swing and provide better margins than ECL logic levels.

Local summation circuits 185, 186, and 187 provide local ATD signals $LATD_0$, $LATD_1$, and $LATD_X$, respectively, for generating timing and activation signals for the memory blocks of memory 110. As illustrated in FIG. 2, local summation circuit 185 provides local ATD signal $LATD_0$ to first local logic circuit 196, and to second local logic circuit 198. There are corresponding first local logic circuits and second local logic circuits for each memory block of memory 110. First local logic circuit 196 includes logic circuitry to combine block select signals BLOCK SELECT with local ATD signal $LATD_0$ for generating control signal BSB. Only the selected memory block of memory 110 receives a control signal BSB.

Control signal BSB activates bit line loads 202 during a write or read recovery operation. The bit lines of memory block 151 are maintained at a precharge voltage level when they are not being accessed for a read or write. Write recovery recharges the bit lines to the precharge voltage level after a write cycle. Read recovery recharges the bit lines to the precharge voltage level after a read cycle. Control signal BSB is also provided to sense amplifiers/column logic 200 to activate the sense amplifiers and column decoding logic to output data onto read global data lines (not shown) during a read cycle. During a write cycle, control signal BSB activates column decoding for selecting the bit line pair to be written. Second local logic circuit 198 receives local ATD signal $LATD_0$ and block select signals BLOCK SELECT during a read or a write cycle to generate control signal BWB to activate WL drivers 201 to select a word line of memory block 151.

During a write cycle of memory 110, input data signals DATA IN are provided to data input buffers/DTD generators 191. DTD generators, similar to ATD generators 189, are included in data input buffers/DTD generators 191 and also receive input data signals DATA IN. In response to detecting a transition from one logic state to another of an input data signal, a DTD pulse is provided to level shifting summation circuit 181. The use of DTD pulses provides a "late write" capability for memory 110. That is, if input data signals are provided to memory 110 near the end of a write cycle, a summation signal allows data to be written into memory 110, thus preventing a loss of data. As can be seen from FIG. 2, DTD pulses are wired-OR summed by the level shift summation circuits, and are used in the same manner as the ATD pulses.

Figure 3:
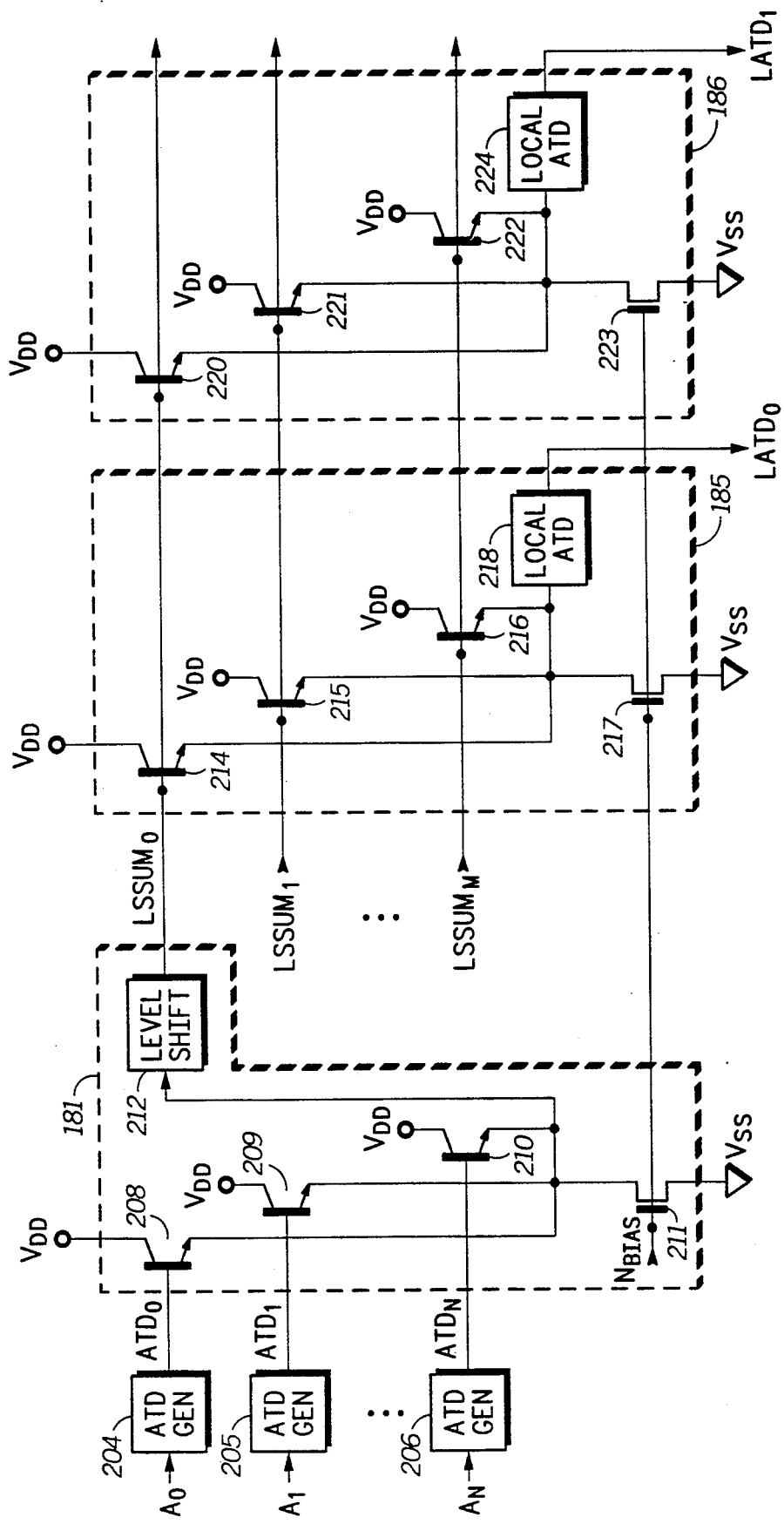
FIG. 3 illustrates in partial block diagram form and partial schematic diagram form a second portion of the SRAM of FIG. 1.

FIG. 3 illustrates in partial block diagram form and partial schematic diagram form a second portion 203 of memory 110 of FIG. 1. FIG. 3 provides some detail for illustrating how ATD pulses are summed in level shifting summation circuits 180–183 and in local summation circuits 185–187. Second portion 203 includes ATD generators 204, 205, and 206, level shifting summation circuit 181 (from FIG. 1), and local summation circuits 185 and 186 (from FIG. 1). First summation circuit 181 includes NPN transistors 208, 209, and 210, N-channel transistor 211, and level shift circuit 212. Local summation circuit 185 includes NPN transistors 214, 215, and 216, N-channel transistor 217, and local ATD generator 218. Local summation circuit 186 inludes NPN transistors 220, 221, and 222, N-channel transistor 223, and local ATD generator 224.

ATD generator 204 has an input terminal for receiving an address signal labeled "$A_0$", and an output terminal for providing an ATD pulse labeled "$ATD_0$". ATD generator 205 has an input terminal for receiving an address signal labeled "$A_1$", and an output terminal for providing an ATD pulse labeled "$ATD_1$". ATD generator 206 has an input terminal for receiving an address signal labeled "$A_N$", and an output terminal for providing an ATD pulse labeled "$ATD_N$".

NPN transistors 208, 209, and 210 are wired-OR connected to an input terminal of level shift circuit 212. NPN transistor 208 has a collector connected to a positive power supply voltage terminal labeled "$V_{DD}$", a base connected to the output terminal of ATD generator 204, and an emitter. NPN transistor 209 has a collector connected to $V_{DD}$, a base connected to the output terminal of ATD generator 205, and an emitter connected to the emitter of NPN transistor 208. NPN transistor 210 has a collector connected to $V_{DD}$, a base connected to the output terminal of ATD generator 206, and an emitter connected to the emitters of NPN transistors 208, 209, and 210, a gate for receiving a bias voltage labeled $N_{BIAS}$, and a source connected to a negative power supply voltage labeled "$V_{SS}$". Level shift circuit 212 has an input terminal connected to the emitters of NPN transistors 208, 209, and 210, and an output terminal for providing a level shifted summation signal labeled "$LSSUM_0$".

NPN transistors 214, 215, and 216 are wired-OR connected to an input terminal of local ATD generator circuit 218. NPN transistor 214 has a collector connected to $V_{DD}$, a base connected to the output terminal of level shift circuit 212, and an emitter. NPN transistor 215 has a collector connected to $V_{DD}$, a base for receiving a level shifted summation signal labeled "$LSSUM_1$", and an emitter connected to the emitter of NPN transistor 214. NPN transistor 216 has a collector connected to $V_{DD}$, a base for receiving a level shifted summation signal labeled "$LSSUM_M$", and an emitter connected to the emitters of NPN transistors 214 and 215. N-channel transistor 217 has a drain connected to the emitters of NPN transistors 214, 215, and 216, a gate for receiving bias voltage $N_{BIAS}$, and a source connected to $V_{SS}$. Local ATD generator 218 has an input terminal connected to the emitters of NPN transistors 214, 215, and 216, and an output terminal for providing a local ATD signal labeled "$LATD_0$".

NPN transistors 220, 221, and 222 are wired-OR connected to an input terminal of local ATD generator circuit 224. NPN transistor 220 has a collector connected to $V_{DD}$, a base connected to the output terminal of level shift circuit 212 for receiving level shifted summation signal $LSSUM_0$, and an emitter. NPN transistor 221 has a collector connected to $V_{DD}$, a base for receiving level shifted summation signal $LSSUM_1$, and an emitter connected to the emitter of NPN transistor 220. NPN transistor 222 has a collector connected to $V_{DD}$, a base for receiving level shifted summation signal $LSSUM_M$, and an emitter connected to the emitters of NPN transistors 220 and 221. N-channel transistor 223 has a drain connected to the emitters of NPN transistors 220, 221, and 222, a gate for receiving bias voltage $N_{BIAS}$, and a source connected to $V_{SS}$. Local ATD generator 224 has an input terminal connected to the emitters of NPN transistors 220, 221, and 222, and an output terminal for providing a local ATD signal labeled "$LATD_1$". In a preferred embodiment, positive power supply voltage terminal $V_{DD}$ is provided with a power supply voltage equal to about 3.3 volts, and negative power supply voltage terminal $V_{SS}$ is connected to ground. Level shifted summation signals $LSSUM_0$, $LSSUM_1$, and $LSSUM_M$ are provided at BICMOS logic levels.

Wired-OR logic, or emitter dotting, is a known technique used for obtaining the logic OR function in positive logic by connecting circuit outputs together. A logic AND function results if negative logic is used. Wired-OR provides a shorter propagation delay than some other types of logic gates used for providing the OR function. Also, using wired-OR results in less device capacitive loading. An N-channel transistor is used in the preferred embodiment to provide a current source for the wired-OR transistors, however in other embodiments, a resistor, or other type of load device could also be used.

In operation, each of ATD generators 204, 205, and 206 provides an ECL level ATD pulse $ATD_0$, $ATD_1$, or $ATD_N$ whenever a transition is detected in corresponding ECL level address signals $A_0$, $A_1$, or $A_N$, respectively. For example, assuming that a transition is detected in address signal $A_0$, and all of the other address signals remain unchanging in a particular logic state, ATD pulse $ATD_0$ is provided as an ECL logic high voltage to the base of NPN transistor 208. NPN transistor 208 is conductive, and NPN transistors 209 and 210 are substantially non-conductive. The voltage at the input terminal of level shift circuit 212 is a logic high voltage equal to approximately the voltage of logic high ATD pulse $ATD_0$, minus one $V_{BE}$ voltage drop across NPN transistor 208, or about one $V_{BE}$ below $V_{DD}$.

NPN transistors 208, 209, and 210 are connected as emitter-follower transistors, where their emitter voltage "follows" their base voltage. If all of the address signals remain unchanging in a particular logic state, ATD pulses $ATD_0$, $ATD_1$, and $ATD_X$ are at logic low voltages. Therefore, the voltage at the input terminal of level shift circuit 212 is a logic low voltage equal to about $V_{SS}$, or ground potential. Level shift circuit 212 provides a logic high level shifted summation signal $LSSUM_0$ to each local ATD summation circuit 185-187 in response to a receiving a logic high ATD pulse. When a logic high ATD pulse is provided to at least one of NPN transistors 208, 209, or 210, level shifting summation circuit 181 causes a logic high voltage to be provided to the input terminal of level shift circuit 212. Level shift circuit 212 is similar to level converter circuit 60 of FIG. 7, which will be discussed later. N-channel transistor 211 receives bias voltage $N_{BIAS}$ and provides a relatively constant current source for NPN transistors 208, 209, and 210. $N_{BIAS}$ is provided at about 1.2 to 1.4 volts.

Each level shifting summation circuit 180, 181, 182, and 183 provides a level shifted summation signal to all of local summation circuits 185, 186, and 187 via ATD bus 184. Each local summation circuit has wired-OR connected NPN transistors for receiving each level shifted summation signal and performing a logical OR function as described for level shifting summation circuit 181. As illustrated in FIG. 3, local summation circuits 185 and 186 receive level shifted summation signals $LSSUM_0$, $LSSUM_1$, and $LSSUM_M$. Any number of local summation circuits 185, 186, and 187 may be used, depending on the size of the memory, the number of memory blocks, or other requirements of the particular application. If a logic high level shifted summation signal is provided by any of level shifting summation circuits 180, 181, 182, or 183, then all of local summation circuits 185, 186, and 187 provide a logic low local ATD signal.

Figure 4:
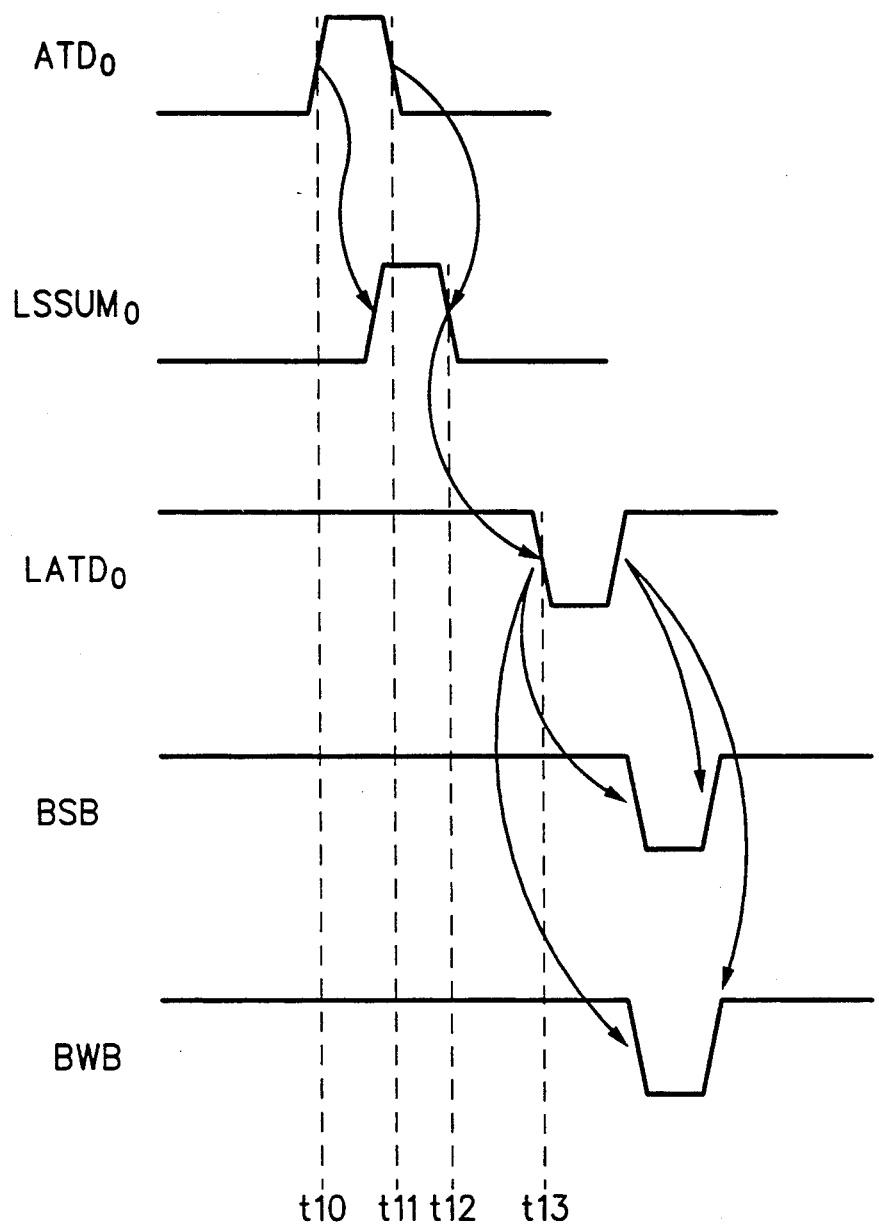
FIG. 4 illustrates a timing diagram of various signals of the SRAM portions of FIG. 2 and FIG. 3.

FIG. 4 illustrates a timing diagram of various signals of the memory portions of FIG. 2 and FIG. 3. (Note that the timing diagram of FIG. 4 is not drawn to scale.) At time t10, ATD pulse $ATD_0$ is provided as a logic high, indicating that at least one of address signals ADDRESS has transitioned from one logic state to another. The particular ATD pulse $ATD_0$ is shown only for purposes of illustration. Any of the other ATD pulses could be substituted in its place. Level shifted summation signal $LSSUM_0$ is generated by ATD pulse $ATD_0$. Note that the trailing edge of ATD pulse $ATD_0$ generates the rising edge of level shifted summation signal $LSSUM_0$, and the falling edge of ATD pulse $ATD_0$ (at time t11) generates the falling edge of level shifted summation signal $LSSUM_0$.

At time t12, the trailing edge of level shifted summation signal $LSSUM_0$ generates the falling edge of local ATD signal $LATD_0$ at time t13. The trailing edge of level shifted summation signal $LSSUM_0$ is used to generate local ATD signal $LATD_0$ in case multiple overlapping ATD pulses are provided to the level shifting summation circuits. The duration of the level shifted summation signals is extended to allow all of the addresses to change before generating a local ATD signal. Control signals BSB and BWB are active at a logic low, and are generated from local ATD signal $LATD_0$. The falling edge of local ATD signal $LATD_0$ generates the falling edge of selected control signals BSB and BWB, and the rising edge of local ATD signal $LATD_0$ generates the rising edge of control signals BSB and BWB.

Generating localized ATD signals provides the advantage of shorter lines to route the ATD signals, thus reducing the amount of parasitic capacitance the ATD generating circuits have to drive. Lower line capacitance reduces power consumption and the need for large drive transistors. Also, the RC delays and propagation delays that are common with a centrally located ATD summation logic circuit are reduced and also more accurately controlled by using wired-OR logic to perform the summation. As a result of better control of propagation and RC delays, the problems associated with skewing of the timing signals is avoided.

FIG. 5 illustrates in schematic diagram form address buffer 20 with ATD generation. Address buffer 20 represents a single address buffer from address buffers 190 and includes differential amplifier 22, emitter-follower transistors 29, 32, and 35, resistors 30, 33, and 38, P-channel transistors 36 and 37, and N-channel transistors 31, 34, and 39. Differential amplifier 22 includes resistors 24 and 25, NPN transistors 26 and 27, and N-channel transistor 28. There is an address buffer like address buffer 20 for every address signal received by memory 110.

Resistor 24 of differential amplifier 22 has a first terminal connected to a positive power supply voltage terminal labeled "$V_{DD}$", and a second terminal connected to output node 101. Resistor 25 has a first terminal connected to $V_{DD}$, and a second terminal connected to output node 102. NPN transistor 26 has a collector connected to the second terminal of resistor 24 at output node 101, a base for receiving an ECL level single-ended address signal labeled "$A_{IN}$", and an emitter. NPN transistor 27 has a collector connected to the second terminal of resistor 25 at output node 102, a base for receiving a reference voltage labeled "$V_{REF}$", and emitter connected to the emitter of NPN transistor 26. N-channel transistor 28 has a drain connected to the emitters of NPN transistors 26 and 27, a gate for receiving a bias voltage labeled "$N_{BIAS}$", and a source connected to a negative power supply voltage terminal labeled "$V_{SS}$". Nodes 101 and 102 are output nodes of differential amplifier 22. Power supply voltage terminal $V_{DD}$ receives a power supply voltage equal to approximately 3.3 volts, and power supply voltage terminal $V_{SS}$ is ground.

Emitter-follower transistor 29 has a collector connected to $V_{DD}$, a base connected to the second terminal of resistor 24 at output node 101, and an emitter. Resistor 30 has a first terminal connected to the emitter of emitter-follower transistor 29, and a second terminal for providing a buffered signal labeled "A*". N-channel transistor 31 has a drain connected to the second terminal of resistor 30, a gate for receiving a power supply dependent bias voltage labeled "$C_{BIAS}$", and a source connected to $V_{SS}$. Emitter-follower transistor 32 has a collector connected to $V_{DD}$, a base connected to the second terminal of resistor 25 at output node 102, and an emitter. Emitter-follower transistors 29, 32, and 35 are NPN transistors. Resistor 33 has a first terminal connected to the emitter of emitter-follower transistor 32, and a second terminal for providing a buffered signal labeled "A". N-channel transistor 34 has a drain connected to the second terminal of resistor 33, a gate for receiving power supply dependent bias voltage $C_{BIAS}$, and a source connected to $V_{SS}$. Emitter-follower transistor 35 has a collector connected to $V_{DD}$, a base, and an emitter. P-channel transistor 36 has a first current electrode connected to the second terminal of resister 25 at output node 102, a gate for receiving a control signals labeled "$FB_2$", and a second current electrode connected to the base of emitter-follower transistor 35. P-channel transistor 37 has a first current electrode connected to the second terminal of resistor 24 at output node 101, a gate for receiving a control signal labeled "$FB_1$", and a second current electrode connected to the base of emitter-follower transistor 35. Resistor 38 has a first terminal connected to the emitter of emitter-follower transistor 35, and a second terminal for providing an ATD pulse labeled "ATD*". N-channel transistor 39 has a drain connected to the second terminal of resistor 38, a gate for receiving bias signal $C_{BIAS}$, and a source connected to negative power supply terminal $V_{SS}$. All of the N-channel and P-channel transistors are MOS (metal-oxide semiconductor) transistors.

In operation, single-ended ECL level address signal $A_{IN}$ is received by address buffer 20 at the base of NPN transistor 26. Address signal $A_{IN}$ swings between an ECL logic high voltage of about −10 volts and an ECL logic low voltage of about −1.7 volts. N-channel transistor 28 receives bias voltage $N_{BIAS}$ and provides a relatively constant current source for differential amplifier 22. $N_{BIAS}$ is provided at about 1.2 to 1.4 volts. Reference voltage $V_{REF}$ is provided to the base of NPN transistor 27 at a voltage level approximately at the midpoint of the logic swing of ECL level address signal $A_{IN}$. If address signal $A_{IN}$ is a logic low, it is more negative than reference voltage $V_{REF}$, causing NPN transistor 26 to be substantially non-conductive and NPN transistor 27 to be conductive. A current designated as "$I_{28}$", through N-channel transistor 28, is steered through NPN transistor 27, and the voltage at output node 102 is equal to $V_{DD}$ minus $I_{28}R_{25}$ where $R_{25}$ is the resistance of resistor 25. The voltage at output node 101 is equal to approximately $V_{DD}$ since there is substantially no current flow through NPN transistor 26. Likewise, if address signal $A_{IN}$ is equal to a logic high voltage, it is more positive than $V_{REF}$, causing NPN transistor 26 to be conductive and NPN transistor 27 to be substantially non-conductive. Current $I_{28}$ is steered through NPN transistor 26 and the voltage at output node 101 is equal to $V_{DD}$ minus $I_{28}R_{24}$ where $R_{24}$ is the resistance of resistor 24, and the voltage at output node 102 will be equal to approximately $V_{DD}$. Therefore, the difference between a logic high and a logic low voltage at nodes 101 and 102 is equal to the voltage drop across either of resistors 24 or 25. In the preferred embodiment, $R_{24}$ is equal to approximately $R_{25}$.

The emitter of emitter-follower transistor 29 provides a voltage equal to the voltage at output node 101 minus one $V_{BE}$. The emitter of transistor 32 provides a voltage equal to the voltage at output node 102 minus one $V_{BE}$. Resistors 30 and 33 perform a level shift function by reducing the voltage provided by emitter-follower transistors 29 and 32. The amount of level shift, or voltage drop, provided by resistors 30 and 33 depends on the amount of current provided by N-channel transistors 31 and 34 and the resistance of resistors 30 and 33.

In the preferred embodiment, resistors 30 and 33 are sized so that buffered signals A and A* swing between an intermediate logic high voltage of about 1.6 volts and a logic low voltage of about 1.0 volt. Power supply dependent bias voltage $C_{BIAS}$ varies with $V_{DD}$ and determines the amount of current provided by N-channel transistors 31 and 34. N-channel transistors 31 and 34 function as voltage controlled current sources. For example, if $V_{DD}$ is chosen to be 3.3 volts, $V_{DD}$ may fluctuate between 2.8 and 4.0 volts. An increase in $V_{DD}$ causes bias voltage $C_{BIAS}$ to increase, and a decrease in $V_{DD}$ causes bias voltage $C_{BIAS}$ to decrease. When $C_{BIAS}$ increases, the current provided by N-channel transistors 31 and 34 increases. Increased current flow increases the voltage drop across resistors 30 and 33. Likewise, a decrease in $V_{DD}$ reduces bias voltage $C_{BIAS}$, which decreases the voltage drop across resistors 30 and 33 because N-channel transistors 31 and 34 provide less current. Therefore, buffered signals A and A* remain constant with respect to $V_{SS}$, or ground, and independent of changes in $V_{DD}$. The circuit that provides $C_{BIAS}$ is illustrated in FIG. 2 and will be discussed later. Since buffered signals A and A* are referenced to $V_{SS}$, better margins and increased signal swings are realized in subsequent stages, even at low power supply voltages.

Emitter-follower transistor 35 is coupled to both nodes 101 and 102 by P-channel transistors 36 and 37. The voltage at the base of emitter-follower transistor 35 is equal to the voltage at output node 101 or output node 102, depending on which of transistors 36 or 37 is conductive. Since the power supply voltage is equal to about 3.0 volts, it is important that there is little or no voltage drop across either of P-channel transistors 36 and 37 when they are conductive. The threshold voltage of P-channel transistors 36 and 37 is about 1.0 volt when the power supply voltage is equal to approximately 3.0 volts. Resistor 38 and N-channel transistor 39 provides a level shift, or voltage drop function as described above for resistors 30 and 33.

Control signals $FB_1$ and $FB_2$ are BICMOS level logic signals and are provided to the gates of P-channel transistors 37 and 36, respectively. In this case, a BICMOS logic high voltage is equal to $V_{DD}$ minus one $V_{BE}$, and a BICMOS logic low voltage is equal to approximately $V_{SS}$ plus one $V_{BE}$. Control signals $FB_1$ and $FB_2$ change logic states a predetermined time, or delay, after address signal $A_{IN}$ transitions from one logic state to another. In the preferred embodiment, control signals $FB_1$ and $FB_2$ are provided by level converter 60 (shown in FIG. 7) as feed back signals. When address signal $A_{IN}$ transitions from one logic state to the next, there is approximately a 1.2 to 1.4 nanosecond propagation delay before control signals $FB_1$ and $FB_2$ change logic states. In other embodiments, control signals $FB_1$ and $FB_2$ may be provided from other sources, as long as the necessary signal swing is available to properly switch P-channel transistors 36 and 37. Also, note that address buffer 20 is an input buffer and is not limited to the detection of address signal transitions. The transition of other types of input signals can be detected as well, such as data signals.

Figure 6:
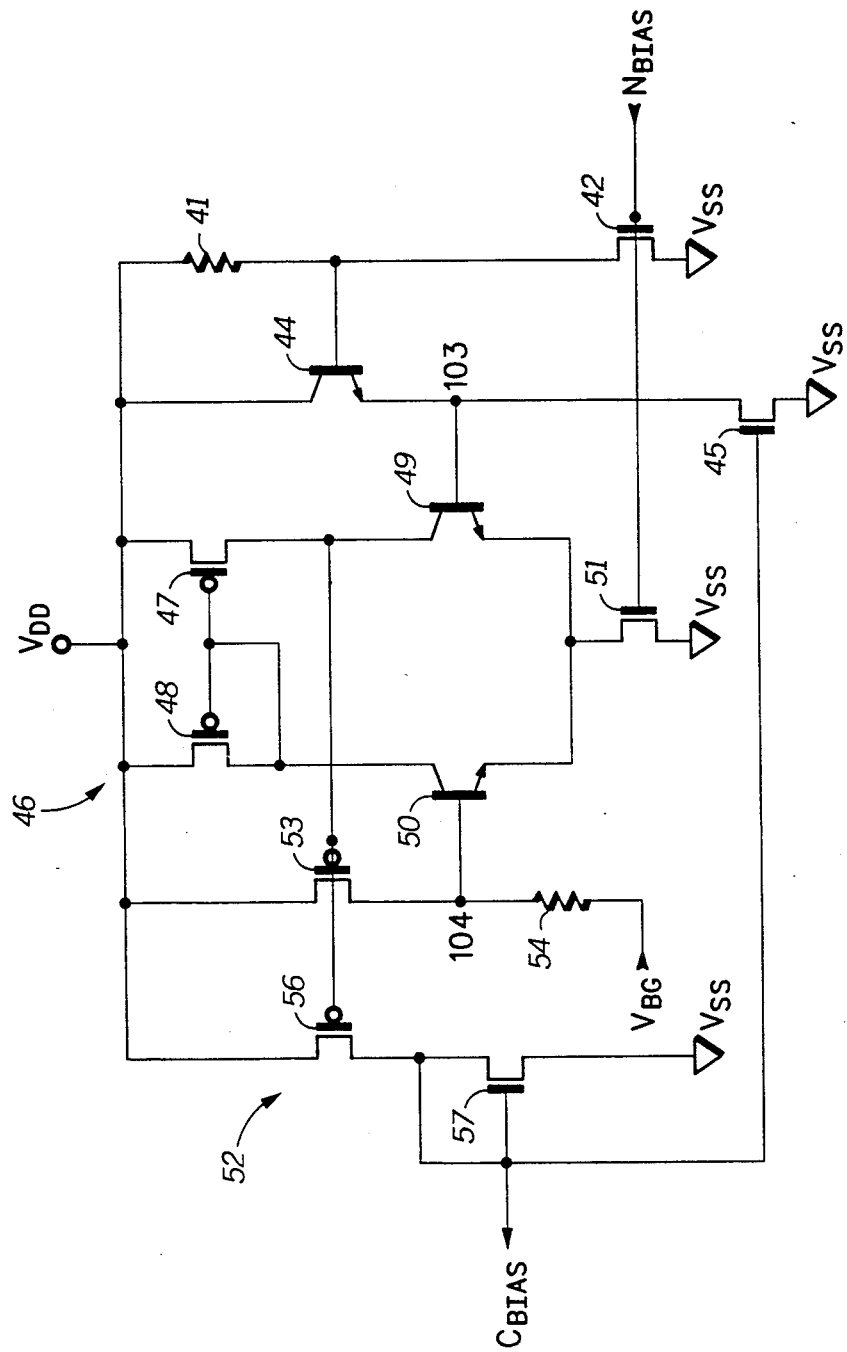
FIG. 6 illustrates in schematic diagram form a power supply dependent bias voltage generator circuit in accordance with the present invention.

FIG. 6 illustrates in schematic diagram form, power supply dependent bias voltage generator circuit 40 in accordance with the present invention. Power supply dependent bias voltage circuit 40 includes resistors 41 and 54, NPN transistor 44, differential amplifier 46, N-channel transistors 42, 45, and 57, and current mirror 52. Differential amplifier 46 includes P-channel transistors 47 and 48, NPN transistors 49 and 50, and N-channel transistor 51. P-channel transistors 47 and 48 function as loads for differential amplifier 46. Current mirror 52 includes P-channel transistors 53 and 56.

Resistor 41 has a first terminal connected to $V_{DD}$, and a second terminal. N-channel transistor 42 has a drain connected to the second terminal of resistor 41, a gate for receiving $N_{BIAS}$, and a source connected to $V_{SS}$. NPN transistor 44 has a collector connected to $V_{DD}$, a base connected to the second terminal of resistor 41, and an emitter connected to node 103. N-channel transistor 45 has a drain connected to the emitter of NPN transistor 44 at node 103, a gate for receiving power supply dependent bias voltage $C_{BIAS}$, and a source connected to $V_{SS}$.

P-channel transistor 47 of differential amplifier 46 has a source connected to $V_{DD}$, a gate, and a drain. P-channel transistor 48 has a source connected to $V_{DD}$, and a gate and a drain connected to the gate of P-channel transistor 47. NPN transistor 49 has a collector connected to the drain of P-channel transistor 47, a base connected to the emitter of NPN transistor 44 at node 103, and an emitter. NPN transistor 50 has a collector connected to the drain of P-channel transistor 48, a base connected to node 104, and an emitter connected to the emitter of NPN transistor 49. N-channel transistor 51 has a drain connected to the emitters of NPN transistors 49 and 50, a gate for receiving bias voltage $N_{BIAS}$, and a source connected to $V_{SS}$.

P-channel transistor 53 of current mirror 52 has a source connected to $V_{DD}$, a gate connected to the drain of P-channel transistor 47, and a drain connected to the base of NPN transistor 50 at node 104. P-channel transistor 56 has a source connected to $V_{DD}$, a gate connected to the gate of P-channel transistor 53, and a drain for providing power supply dependent bias voltage $C_{BIAS}$. Resistor 54 has a first terminal connected to the base of transistor 50 at node 104, and a second terminal for receiving a band gap voltage labeled "$V_{BG}$". N-channel transistor 57 has a gate and a drain connected to the drain of P-channel transistor 56, and a source connected to $V_{SS}$.

In operation, N-channel transistor 42 provides a relatively constant current source for resistor 41, making the voltage drop across resistor 41 relatively constant with respect to $V_{DD}$. NPN transistor 44 provides a voltage to the base of NPN transistor 49 at node 103 that is approximately equal to the voltage at the second terminal of resistor 41, minus one $V_{BE}$. Since the voltage drop across resistor 41 is relatively constant with respect to $V_{DD}$, the voltage at node 103 is also relatively constant with respect to $V_{DD}$. P-channel transistors 47 and 48 form a current mirror, causing the collector current of NPN transistor 50 to follow the collector current of NPN transistor 49. P-channel transistor 53 and resistor 54 complete a feedback path from the base of NPN transistor 50 to the collector of NPN transistor 49. Therefore, the voltage at node 104 follows the variations of the voltage at node 103, and the voltage at nodes 103 and 104 are approximately equal.

Bandgap voltage $V_{BG}$ is a conventional bandgap generated reference voltage and is provided to the second terminal of resistor 54. A bandgap generated reference voltage is substantially independent of changes in power supply voltage, temperature, and processing. Therefore, the voltage drop across resistor 54 varies proportionally to $V_{DD}$, causing the drain-source current through P-channel transistor 53 to vary as $V_{DD}$ varies. P-channel transistors 53 and 56 form current mirror 52. As the drain-source current through P-channel transistor 53 changes, the drain-source current through P-channel transistor 56 "mirrors" the change in drain-source current. The gate-to-source voltage of N-channel transistor 57 provides power supply dependent bias voltage $C_{BIAS}$. N-channel transistor 57 remains in saturation. Therefore, the drain-source current of N-channel transistor 57 changes as $V_{DD}$ changes. If $V_{DD}$ increases, power supply dependent bias voltage $C_{BIAS}$ increases, and if $V_{DD}$ decreases, bias voltage $C_{BIAS}$ decreases.

The characteristics of some integrated circuit devices change with respect to temperature, process, or power supply variations. Power supply dependent bias voltage generator circuit 40 matches the temperature variations of address buffer 20. NPN transistor 44 of power supply dependent bias voltage circuit 40 tracks the $V_{BE}$ voltage shifts of NPN transistors 29, 32, and 35 of address buffer 20, illustrated in FIG. 5. When the current provided to transistors 29, 32, and 35 by N-channel transistors 31, 34, and 39 changes with respect to power supply, temperature, or process changes, the current provided to NPN transistor 44 by N-channel transistor 45 also changes, causing the $V_{BE}$ voltage drop across NPN transistor 29 or 32 to be the same as the voltage drop across NPN transistor 44. Also, current tracking is accomplished by providing bias voltage $C_{BIAS}$ to the gate of N-channel transistor 45. In addition, resistor 54 tracks the temperature variations of resistors 30, 33, and 38.

Figure 7:
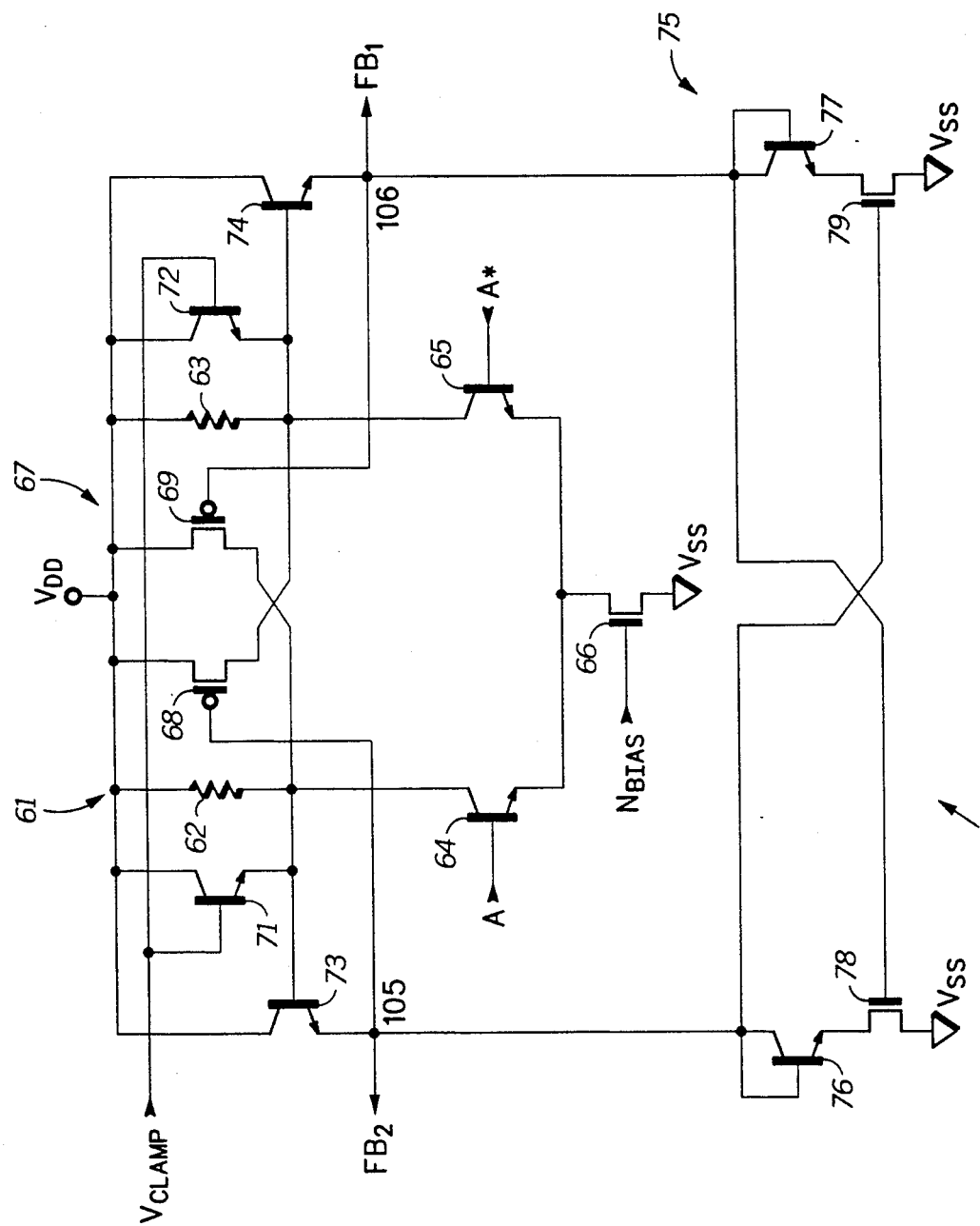
FIG. 7 illustrates in schematic diagram form a level converter in accordance with the present invention.

FIG. 7 illustrates in partial schematic diagram form level converter 60 in accordance with the present invention. Level converter 60 includes differential amplifier 61, cross-coupled pull-up circuit 67, NPN transistors 71, 72, 73, and 74, and cross-coupled half-latch 75. Differential amplifier 61 includes resistors 62 and 63, NPN transistors 64 and 65, and N-channel transistor 66. Cross-coupled half-latch 75 includes NPN transistors 76 and 77 and N-channel transistors 78 and 79.

Resistor 62 of differential amplifier 61 has a first terminal connected to a power supply voltage terminal labeled "$V_{DD}$", and a second terminal. Resistor 63 has a first terminal connected to $V_{DD}$, and a second terminal. NPN transistor 64 has a collector connected to the second terminal of resistor 62, a base for receiving buffered signal A, and an emitter. NPN transistor 65 has a collector connected to the second terminal of resistor 63, a base for receiving buffered signal A*, and an emitter connected to the emitter of NPN transistor 64. N-channel transistor 66 has a drain connected to the emitters of transistors 64 and 65, a gate for receiving bias voltage $N_{BIAS}$, and a source connected to $V_{SS}$.

Cross-coupled pull-up circuit 67 includes P-channel transistors 68 and 69. P-channel transistor 68 has a source connected to $V_{DD}$, a gate connected to the emitter of NPN transistor 73 at node 105, and a drain connected to the second terminal of resistor 63. P-channel transistor 69 has a source connected to $V_{DD}$, a gate connected to the emitter of transistor 74 at node 106, and a drain connected to the second terminal of resistor 62.

NPN transistor 71 has a collector connected to $V_{DD}$, a base for receiving a bias voltage labeled "$V_{CLAMP}$", and an emitter connected to the second terminal of resistor 62. NPN transistor 72 has a collector connected to $V_{DD}$, a base for receiving bias voltage $V_{CLAMP}$, and an emitter connected to the second terminal of resistor 63. Emitter-follower transistor 73 is an NPN transistor and has a collector connected to $V_{DD}$, a base connected to the second terminal of resistor 62, and an emitter for providing control signal $FB_2$ at node 105. Emitter-follower transistor 74 is also an NPN transistor and has a collector connected to $V_{DD}$, a base connected to the second terminal of resistor 63, and an emitter for providing control signal $FB_1$ at node 106. NPN transistor 76 has a base and a collector connected to the emitter of emitter-follower transistor 73 at node 105, and an emitter. NPN transistor 77 has a base and a collector connected to the emitter of emitter-follower transistor 74 at node 106, and an emitter. NPN transistors 76 and 77 are diode-connected transistors and function as diodes. N-channel transistor 78 has a drain connected to the emitter of NPN transistor 76, a gate connected to the collector of NPN transistor 77, and a source connected to $V_{SS}$. N-channel transistor 79 has a drain connected to the emitter of NPN transistor 77, a gate connected to the collector of NPN transistor 76, and a source connected to $V_{SS}$.

In operation, level converter 60 receives buffered signals A and A* from address buffer 20 of FIG. 5, and provides control signals $FB_1$ and $FB_2$ at nodes 106 and 105, respectively. Note that the signals at nodes 105 and 106 are also provided to address predecoders, including block predecoder 194 (FIG. 2). Buffered signals A and A* are differential signals that swing between an intermediate logic high voltage of 1.6 volts and an intermediate logic low voltage of 1.0 volt. If buffered signal A is at an intermediate logic high voltage and buffered signal A* is at an intermediate logic low voltage, then a current designated as $I_{66}$ through N-channel transistor 66 is steered through NPN transistor 64 so that the voltage at the base of emitter-follower transistor 73 is reduced, causing emitter-follower transistor 73 to be substantially non-conductive. The voltage at the base of emitter-follower transistor 74 is increased, causing emitter-follower transistor 74 to be conductive. When transistor 74 is conductive, node 106 is a logic high voltage equal to approximately $V_{DD}$ minus one $V_{BE}$.

When node 106 is a logic high voltage, and emitter-follower transistor 73 is substantially non-conductive, N-channel transistor 78 is conductive, thus reducing the voltage at node 105 to a logic low voltage. When node 105 is reduced to a logic low voltage of about 0.6 volts, diode-connected NPN transistor 76 becomes substantially non-conductive, causing N-channel transistor 78 to become substantially non-conductive. If N-channel transistor 78 remained conductive, current would continue to flow unnecessarily, thus increasing power consumption. Since node 105 is a low voltage, the voltage at the gate of N-channel transistor 79 is low enough to cause N-channel transistor 79 to be substantially non-conductive. Also, a low voltage at node 105 causes P-channel transistor 68 of cross-coupled pull-up circuit 67 to be conductive, which helps to increase the voltage at the base of emitter-follower transistor 74 more rapidly.

If buffered signal A is an intermediate logic low and buffered signal A* is an intermediate logic high, then a current designated as $I_{66}$ through N-channel transistor 66 is steered through NPN transistor 65. The voltage at the base of emitter-follower transistor 74 is reduced, resulting in emitter-follower transistor 74 becoming substantially non-conductive. The voltage at the base of emitter-follower transistor 73 is a logic high causing emitter-follower transistor 73 to become conductive, and node 105 is a logic high voltage equal to $V_{DD}$ minus one $V_{BE}$. When node 105 is a logic high voltage and emitter follower transistor 74 is non-conductive, N-channel transistor 79 is conductive, thus reducing the voltage at node 106 to a logic low. Since node 106 is low, N-channel transistor 78 is substantially non-conductive. When the voltage at node 106 reduced to a logic low, P-channel transistor 69 is conductive, which helps to increase the voltage at the base of NPN transistor 73 more rapidly.

In other embodiments, the gates of P-channel transistors 68 and 69 may be connected to the second terminals of resistors 62 and 63, respectively. This provides a higher voltage to the gates of transistors 68 and 69, thus causing them to be less conductive and reducing the amount of base drive provided to emitter-follower transistors 73 and 74.

Cross-coupled half-latch 75 provides the advantage of reduced power consumption. N-channel transistors 78 and 79 are cross-coupled and are conductive only when necessary to reduce the voltage of nodes 105 or 106 to a logic low. Diode-connected NPN transistors 76 and 77 prevent a leakage current from flowing, thus ensuring that N-channel transistors 78 and 79 remain non-conductive during a logic low state.

Resistors 62 and 63 are sized appropriately to account for power supply variations. They are sized relatively large to prevent diode-connected NPN transistors 76 and 77 from becoming conductive at high power supply voltages. As the power supply voltage increases, the voltage at nodes 105 and 106 tends to increase. If a logic low voltage at node 105 or 106 increases above about 0.6 voltages, the base-emitter voltage of diode-connected NPN transistors 76 and 77 increases above 0.6 volts, and N-channel transistors 78 and 79 may become, at least partially, conductive when they should be substantially non-conductive. But, if resistors 62 and 63 are too large, the speed of level converter 60 may be adversely affected.

For very high speed operation, differential amplifier 61 and cross-coupled pull-up circuit 67 may be provided with a regulated power supply voltage. If a regulated power supply voltage is used, the size of resistors 62 and 63 may be reduced to allow for the reduced power supply variation.

A clamping circuit, comprising NPN transistors 71 and 72 and bias voltage $V_{CLAMP}$, prevents NPN transistors 64 and 65 from operating in the saturation region. Generally, a bipolar transistor operates in the saturation region when both the base-emitter and base-collector junctions are forward biased by more than approximately 0.7 volts. The base-collector junction of NPN transistors 64 and 65 may become forward biased as a result of several different conditions. For example, if buffered signals A and A* are allowed to increase to a high voltage level as a result of power supply fluctuations, NPN transistors 64 and 65 may operate in saturation. Also, if the drain-source current provided by N-channel transistor 66 is allowed to vary, the collector voltage of NPN transistors 64 or 65 may be reduced to a level that will cause NPN transistors 64 and 65 to operate in saturation. Bias voltage $V_{CLAMP}$ is provided to the bases of NPN transistors 71 and 72 at about 2.1 volts, preventing the collectors of NPN transistors 64 and 65 from going below about 1.3 volts. This causes NPN transistor 64 and 65 to stay in the active region of operation. Operating NPN transistors 64 and 65 in the active region provides the advantage of increased operating speed.

Figure 8:
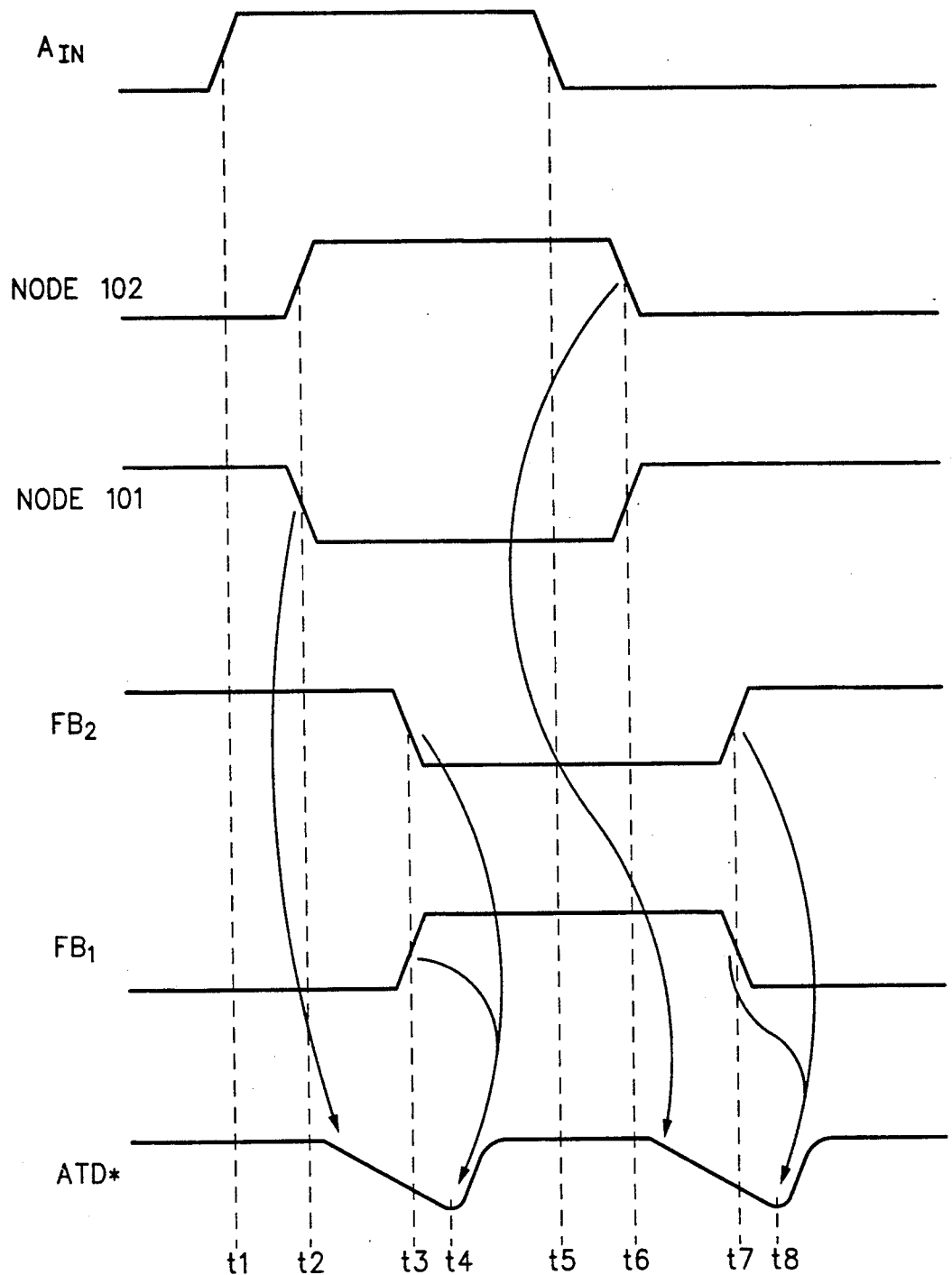
FIG. 8 shows a timing diagram of various signals of the address buffer with ATD generation of FIG. 5.

FIG. 8 shows a timing diagram of various signals of address buffer 20 of FIG. 5 in accordance with the present invention. (Note that the timing diagram of FIG. 8 is not drawn to scale.) Before time t1, address signal $A_{IN}$ is shown at a low logic state. Referring back to FIG. 5, when address signal $A_{IN}$ is a logic low, output node 102 is a logic low and output node 101 is a logic high. Control signal $FB_1$ is a logic low voltage causing P-channel transistor 37 (FIG. 5) to be conductive. P-channel transistor 37 provides the voltage at output node 101 to the base of emitter-follower transistor 35, causing emitter-follower transistor 35 to be at a logic high. Therefore, prior to time t1, ATD pulse ATD* is provided at a logic high voltage.

At time t1, address signal $A_{IN}$ transitions to a logic high voltage, which reverses the logic states of nodes 101 and 102, as shown occurring at time t2. As the voltage at output node 101 decreases to a logic low voltage, the voltage at the base of emitter-follower transistor 35 begins to decrease, since P-channel transistor 37 is conductive, causing the voltage at the emitter of emitter-follower transistor 35 to decrease. This is illustrated in FIG. 8 as waveform ATD* decreasing to a logic low voltage.

At time t3, control signals $FB_1$ and $FB_2$ change logic states, causing P-channel transistor 36 to become conductive and P-channel transistor 37 to be substantially non-conductive. By this time, the voltages at nodes 101 and 102 have completely transitioned to their new logic states, so that when P-channel transistor 36 becomes conductive, the voltage at the base of emitter-follower transistor 35 rises quickly, causing the voltage at the emitter of emitter-follower transistor 35 to quickly become a logic high. ATD pulse ATD* increases to a logic high voltage as shown at time t4. The time interval between time t1 and time t3 is approximately 1.2–1.4 nanoseconds. Note that the rising edge of ATD pulse ATD* increases to a logic high very quickly, as compared to its falling edge. This does not cause a problem in the preferred embodiment, because it is the rising edge of ATD pulse ATD* that initiates the preconditioning and activation signals of an integrated circuit memory.

At time t5, address signal $A_{IN}$ transitions from a logic high to a logic low, which causes output node 102 to transition to a logic low and output node 101 to transition to a logic high at time t6. As the voltage at output node 102 decreases to a logic low voltage, the voltage at the base of emitter-follower transistor 35 (FIG. 5) begins to decrease, causing ATD pulse ATD* to begin to drop, as shown just after time t6. At this time, control signal $FB_1$ is still a logic high voltage and control signal $FB_2$ is a logic low voltage, thereby keeping P-channel transistor 37 conductive and P-channel transistor 36 substantially non-conductive. At time t7, control signals $FB_1$ and $FB_2$ change logic states, causing P-channel transistor 36 to become conductive and P-channel transistor 37 to be substantially non-conductive. By this time, the voltages at nodes 101 and 102 have completely transitioned to their new logic states, so that when P-channel transistor 36 becomes conductive, the voltage at the base of emitter-follower transistor 35 rises rapidly, causing emitter-follower transistor 35 to become conductive quickly. The rising edge of ATD pulse ATD* increases to a logic high voltage as shown at time t8.

The falling edge of ATD pulse ATD* is caused by whichever of nodes 101 or 102 transitions to a logic low voltage. The rising edge of ATD pulse ATD* is caused by both of control signals $FB_1$ and $FB_2$ transitioning. ATD pulse ATD* is provided by address buffer 20 each time address signal $A_{IN}$ changes logic states, either from a logic high to a logic low, or from a logic low to a logic high. ATD pulse ATD* is provided at logic levels controlled by resistors 24, 25, 33, and 38, and is active at a logic low. However, in other embodiments, ATD pulse ATD* may be provided as a logic high pulse, and/or may be provided at different logic levels, depending on the application.

Address buffer 20 provides an ATD pulse very quickly after address signal $A_{IN}$ changes logic states, because the pulse is generated in the address buffer, rather than by a separate ATD pulse generator circuit. In addition, address buffer 20 requires less surface area on an integrated circuit memory for generating an ATD pulse, since additional dedicated ATD pulse generating circuitry is not needed.

While the invention has been described in the context of a preferred embodiment, it will be apparent to those skilled in the art that the present invention may be modified in numerous ways and may assume many embodiments other than that specifically set out and described above. For example, the four described memory sections could be increased or decreased in size or number. Also, memory 110 can be modified to receive input signals at logic levels other than ECL, such as GTL (Gunning transceiver logic), TTL (transistor-transistor logic), or CMOS (complementary metal-oxide semiconductor). Accordingly, it is intended by the appended claims to cover all modifications of the invention which fall within the true spirit and scope of the invention.

What is claimed is:

1. An integrated circuit memory, comprising:
    a plurality of blocks of memory cells, each block comprising a plurality of memory cells located at intersections of word lines and bit line pairs;
    address means for receiving a plurality of address signals, and in response, providing decoded address signals for selecting a memory cell;
    a plurality of address transition detectors, each address transition detector having an input terminal coupled to one of said plurality of address signals, each address transition detector providing an ATD (address transition detection) pulse at an output terminal in response to detecting when the address signal coupled to its input terminal transitions from one logic state to another;
    first summation means, coupled to said output terminals of said plurality of address transition detectors, for providing a first summation signal in response to at least one of said plurality of address transition detectors providing an ATD pulse; and local summation means comprising a plurality of local summation circuits, positioned adjacent to said plurality of blocks of memory cells, each local summation circuit coupled to a predetermined number of said plurality of blocks of memory cells, and to said first summation means, for receiving said first summation signal, and providing a local ATD signal for providing timing and activation control signals for said predetermined number of said plurality of blocks of memory cells.

2. The integrated circuit memory of claim 1, wherein said address signals are characterized as being ECL level address signals.

3. The integrated circuit memory of claim 1, wherein said output terminals of each of said address transition detectors are wired-OR connected to an input terminal of said first summation means.

4. The integrated circuit memory of claim 1, further comprising a data transition detector having an input terminal for receiving a data signal, said data transition detector providing an DTD (data transition detection) pulse at an output terminal in response to detecting a transition from one logic state to another of said data signal, said output terminal of said data transition detector being wired-OR connected to an input terminal of said first summation means.

5. The integrated circuit memory of claim 1, further comprising first local logic means, positioned adjacent to said plurality of blocks of memory cells, for receiving a block select signal and said local ATD signal and providing a control signal for activating selected bit line loads for a selected block of memory cells.

6. The integrated circuit memory of claim 1, further comprising second local logic means, positioned adjacent to said blocks of memory cells, for receiving a block select signal, said decoded address signals, and said local ATD signal, and providing a control signal for selecting a word line in a selected block of memory cells.

7. The integrated circuit memory of claim 1, wherein said integrated circuit memory is a static random access memory.

8. A static random access memory having address transition detection (ATD), comprising:

at least one memory section comprising a plurality of blocks of memory cells, said memory cells located at intersections of word lines and bit line pairs;

address decoding means for receiving a plurality of address signals, and in response, providing decoded address signals for selecting a memory cell;

a plurality of address transition detectors, each address transition detector having an input terminal coupled to one of said plurality of address signals, each address transition detector providing an ATD pulse at an output terminal in response to detecting when an address signal coupled to its input terminal transitions from one logic state to another;

first summation means, coupled to said output terminals of said plurality of address transition detectors, for providing a first summation signal in response to at least one of said plurality of address transition detectors providing an ATD pulse; and local summation means comprising a plurality of local summation circuits, positioned adjacent to said at least one memory section, each local summation circuit coupled to a predetermined number of adjacent blocks of said plurality of blocks of memory cells, and to said first summation means, for receiving said first summation signal, and providing a local ATD signal for providing accurate timing and activation control signals for said predetermined number of said plurality of blocks of memory cells.

9. The static random access memory of claim 8, wherein said address signals are characterized as being ECL level address signals.

10. The static random access memory of claim 8, wherein said output terminals of each of said address transition detectors are wire-OR connected to an input terminal of said first summation means.

11. The static random access memory of claim 8, further comprising a data transition detector having an input terminal for receiving a data signal, said data transition detector providing a data transition detection (DTD) pulse at an output terminal in response to detecting when said data signal transitions from one logic state to another, said output terminal of said data transition detector being wired-OR connected to an input terminal of said first summation means.

12. The static random access memory of claim 8, further comprising first local logic means, positioned adjacent to said at least one memory section, for receiving a block select signal and said local ATD signal, and providing a control signal for activation selected bit line loads for a selected block of memory cells.

13. The static random access memory of claim 8, further comprising second local logic means, positioned adjacent to said at least one memory section, for receiving a block select signal, said decoded address signals, and said local ATD signal, and providing a control signal for selecting a word line in a predetermined block of memory cells.

14. The static random access memory of claim 8, further comprising a plurality of address buffers with ATD generation positioned along a periphery of said static random access memory, each address buffer receiving an ECL level address signal, providing buffered complementary address signals for selection a memory cell, and providing an ATD pulse in response to detecting when said ECL level address signal transitions from one logic state to another.

15. The static random access memory of claim 8, wherein said first summation means further comprises level shifting means for level shifting said ATD pulse to BICMOS logic levels.

16. A static random access memory having address transition detection (ATD), comprising:

a first section of memory cell blocks comprising a plurality of blocks of memory cells, said memory cells located at intersections of word lines and bit line pairs;

a second section of memory cell blocks comprising a plurality of blocks of memory cells, said memory cells located at intersections of word lines and bit line pairs;

a plurality of address buffers with ATD generation positioned along a periphery of said static random access memory, each address buffer receiving an ECL level address signal, providing buffered complementary address signals, and providing an ATD pulse at an output terminal in response to detecting when said address signal transitions from one logic state to another;

address decoding means for receiving said buffered complementary address signals, and in response, selecting a memory cell of a predetermined block of memory cells;

first summation means, coupled to said output terminals of each of said plurality of address buffers with ATD generation, and positioned at a central portion of said periphery, for level shifting said ATD pulse to a BICMOS logic level summation signal in response to at least one of said address buffers with ATD generation providing an ATD pulse; and local summation means comprising a plurality of local summation circuits, positioned adjacent to and between said first and second sections of memory cell blocks, and coupled to said first summation means, each local summation circuit receiving said first summation signal, and providing a local ATD signal for generating timing and activation control signals for a predetermined number of said memory cell blocks of said first and second sections of memory cell blocks.

17. The static random access memory of claim 16, wherein said output terminals of each of said address buffers with ATD generation are wired-OR connected to an input terminal of said first summation means.

18. The static random access memory of claim 16, further comprising a data transition detector having an input terminal for receiving a data signal, said data transition detector providing a DTD pulse at an output terminal in response to detecting when said data signal transitions from one logic state to another, said output terminal of said data transition detector being wired-OR connected to an input terminal of said first summation means.

19. The static random access memory of claim 16, further comprising first local logic means, positioned adjacent to each of said blocks of memory cells, for receiving a block select signal and said local ATD signal and providing a control signal for activation selected bit line loads for a selected block of memory cells.

20. The static random access memory of claim 16, further comprising second local logic means, positioned adjacent to each of said blocks of memory cells, for receiving a block select signal, said decoded address signals, and said local ATD signal and providing a control signal for selecting a word line in a selected block of memory cells.

* * * * *